(12) United States Patent
West

(10) Patent No.: US 7,432,649 B2
(45) Date of Patent: Oct. 7, 2008

(54) COUPLED WAVEGUIDES FOR LIGHT EXTRACTION

(75) Inventor: James A West, Painted Post, NY (US)

(73) Assignee: Corning, Incorporated, Corning, NY (US)

( * ) Notice: Subject to any disclaimer, the term of this patent is extended or adjusted under 35 U.S.C. 154(b) by 185 days.

(21) Appl. No.: 11/064,236

(22) Filed: Feb. 22, 2005

(65) Prior Publication Data

US 2006/0186801 A1    Aug. 24, 2006

(51) Int. Cl.
   *H01J 1/62* (2006.01)
(52) U.S. Cl. ............... 313/506; 313/504; 313/505; 313/483; 313/498; 428/690; 428/917
(58) Field of Classification Search ............ 313/506
   See application file for complete search history.

(56) References Cited

U.S. PATENT DOCUMENTS

| | | | | |
|---|---|---|---|---|
| 5,994,835 | A * | 11/1999 | Wilson et al. | 313/504 |
| 6,104,137 | A * | 8/2000 | Abiko et al. | 313/506 |
| 6,191,764 | B1 * | 2/2001 | Kono et al. | 313/504 |
| 6,472,817 | B1 * | 10/2002 | Kawase | 313/504 |
| 6,831,407 | B2 * | 12/2004 | Cok | 313/504 |
| 2002/0015562 | A1 * | 2/2002 | Kikuchi et al. | 385/47 |
| 2003/0020399 | A1 * | 1/2003 | Moller et al. | 313/504 |
| 2003/0127973 | A1 * | 7/2003 | Weaver et al. | 313/504 |
| 2004/0070004 | A1 | 4/2004 | Eliashevich et al. | 257/200 |
| 2004/0086746 | A1 | 5/2004 | Lin et al. | 428/690 |
| 2004/0104672 | A1 | 6/2004 | Shiang et al. | 313/506 |
| 2004/0113550 | A1 | 6/2004 | Adachi et al. | 313/512 |
| 2005/0077820 | A1 * | 4/2005 | Onishi et al. | 313/506 |

FOREIGN PATENT DOCUMENTS

JP       2002056968 A   *  2/2002

OTHER PUBLICATIONS

Lu, Yi-Bin et al., "A gain-flattened L-band dual-core erbium-doped fibre amplifier", Optics Communications 220 (2003) 303-308.

* cited by examiner

*Primary Examiner*—Sikha Roy
*Assistant Examiner*—Natalie K Walford
(74) *Attorney, Agent, or Firm*—Bruce P. Watson; Kevin M. Able

(57) ABSTRACT

A light source includes a first waveguide. The first waveguide includes a light emitting material having a first index of refraction and at least one layer is disposed over the light emitting material. The at least one layer has a second index of refraction and the first index of refraction is greater than the second index of refraction. The light source also includes a second waveguide, which is coupled to the first waveguide. The light emitting device also includes a light extraction structure.

25 Claims, 7 Drawing Sheets

COUPLED WAVEGUIDES FOR LIGHT EXTRACTION

BACKGROUND

Display devices are employed in diverse applications. For example, televisions, computers, telephones and personal digital assistants (PDAs) all have a display. In some display applications, it is useful to provide a large viewing area, while in others it is useful to provide a small viewing area. In many applications it is desirable for the display to be relatively thin. Similar demands are often placed on lighting structures. For example, many light sources in liquid crystal displays (LCDs) are usefully thin thereby fostering a thin LCD device.

There exists a variety of light source technologies available for display and lighting applications. One light source technology that has received attention in the display and lighting industries is the organic light emitting device/diode (OLED). OLEDs are often made from electroluminescent polymers and small-molecule structures.

The basic OLED structure includes an organic light emitting material disposed between an anode and a cathode, which are normally disposed on opposing sides of the material. When current is supplied to the organic light emitting material, light is given off through the radiative decay of excitons formed by the recombination of electrons from the cathode and holes from the anode. As can be readily appreciated, the light emitted from the OLED can be used in lighting (e.g., backlight) and display device applications.

In order to form a display device, a plurality of anodes and cathodes are driven by a thin film transistor (TFT) circuit. The anodes and cathodes are formed in an array, which in turn provides an array of picture elements (pixels) from the OLED material. Display images can then be formed by the selective application of current through the anodes and cathodes, which are driven by the TFT circuit.

Lighting applications also may be based on the driving of the OLEDs via cathodes and anodes. Of course, the selective application of current and array structures comprised of cathodes and anodes needed to realize pixels in displays is foregone. Rather, a less complex anode and cathode structure may be used.

While OLED-based displays and lighting sources are viable alternatives to known display and lighting technologies, there are shortcomings to known OLED-based structures. For example, known OLED structures are not conducive to efficient light output (luminance). In fact, in many known OLED structures, as much as 80% of the light energy emitted by the OLEDs is trapped in the device. In order to improve the amount of light emitted from the device, it is necessary to drive the OLEDs at relatively high current levels. However, these relatively high drive currents have a deleterious impact on lifetime of the OLED. To wit, a unit increase in the drive current results in a unit exponential decrease in device lifetime.

There are many factors that can adversely impact the amount of light transmitted from the OLED to the external environment (e.g., viewing surface of a display). One such factor is total internal reflection (TIR). As is well known, many organic materials used in OLEDs have a relatively high index of refraction ($n_{org}$). For example, $n_{org} > 1.8$. As such, the organic material (and other layers surrounding the organic layer) forms a waveguide, which can trap a significant portion of the light generated by the OLED. Clearly, this light will not be transmitted to the external environment. Illustratively, if the organic layer interfaces air, the classical limit of the emitted light is given by: $1/(2 n_{org})^2$. As such only approximately 17% of the emitted light emitted by the OLED material reaches the air.

While certain attempts to reduce internal reflection have been made, these have met with mixed results. As such, there remains a need to improve the light output efficiency of OLEDs and thus increase the lifetime of such devices.

SUMMARY

In accordance with an example embodiment, a light source includes a first waveguide. The first waveguide includes a light emitting material having a first index of refraction and at least one layer disposed over the material. The at least one layer has a second index of refraction and the first index of refraction is greater than the second index of refraction. The light source also includes a second waveguide, which is coupled to the first waveguide; and a light extraction structure, which is adapted to direct light from the light sources and substantially into free space.

In accordance with an example embodiment, an organic light emitting device (OLED) includes a first waveguide, which includes an organic light emitting material having a first index of refraction, and a cathode and an anode. The OLED also includes at least one layer disposed over the material, wherein the at least one layer has a second index of refraction and the first index of refraction is greater than the second index of refraction. Moreover, the OLED includes a second waveguide, which is coupled to the first waveguide; and a light extraction structure.

BRIEF DESCRIPTION OF THE DRAWINGS

The example embodiments are best understood from the following detailed description when read with the accompanying drawing figures. It is emphasized that the various features are not necessarily drawn to scale. The dimensions may be arbitrarily increased or decreased for clarity of discussion.

DETAILED DESCRIPTION

Figure 1:
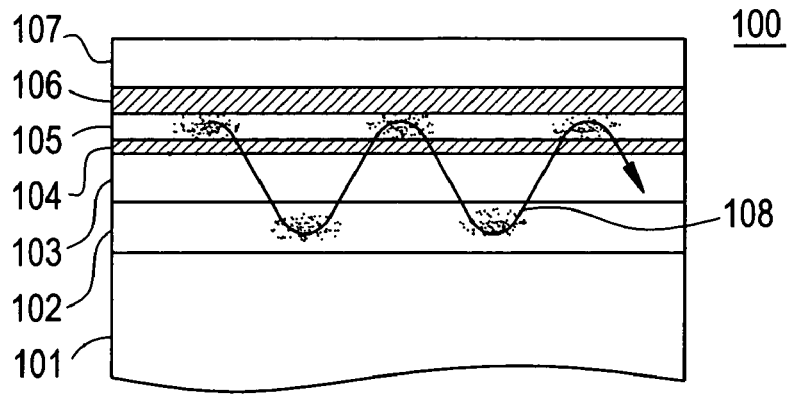
FIG. 1 is a partial cross-sectional view of a waveguide, including an organic light emitting layer, coupled to another waveguide in accordance with an example embodiment.

In the following detailed description, for purposes of explanation and not limitation, example embodiments disclosing specific details are set forth in order to provide a thorough understanding of the present invention. However, it will be apparent to one having ordinary skill in the art having had the benefit of the present disclosure that the present invention may be practiced in other embodiments that depart from the specific details disclosed in connection with the example embodiments. Moreover, descriptions of well-known devices, methods and materials may be omitted so as to not obscure the description of the present invention.

In the example embodiments described herein, coupled waveguide structures for improving the light output or luminance from a light emitting layer (also referred to as an active layer) are described in significant detail. The light emitting layer has an index of refraction that is greater than an adjacent layer. Illustratively, the light emitting layer is an organic light emitting layer. However, it is emphasized that the example embodiments are applicable generally to light sources that suffer from light trapping due to TIR. For example, the example embodiments may be applied to organic electroluminescent (EL) light sources generally as well as inorganic EL light sources.

Illustratively, the light sources described in connection with the example embodiment may be deployed in display and lighting applications. The light sources may be used in many types of display and microdisplay devices; and the light sources may also be used in many types of lighting applications such as backlighting. These noted applications are meant only to be illustrative and not limiting of the example embodiments.

As will become clearer as the present description continues, the active layer may be a component of an active waveguide, which is coupled to a passive waveguide. In addition to other considerations, in order to achieve suitable coupling between the waveguides, the optical mode(s) that is (are) coupled between the waveguide(s) has (have) an effective index of refraction that is within a prescribed range depending on the materials and structure of the coupled waveguides.

In example embodiments the passive waveguide includes a light extraction feature such as a bulk scattering layer, a microlens or microstructured array, a periodic structure such as a grating or a photonic crystal, a deflector(s)/reflector(s) such as a mesa structure(s), or a combination thereof. Notably, the light extraction features of the example embodiments direct the light from the light emitting device to free space. For example, a lighting application the light extraction feature directs the light from the light emitting devices to the surrounding free space. Illustratively, the light extraction features direct the light in one or both of the two directions that are orthogonal to the direction of propagation of light incident on the light extraction features.

In addition, in guided electromagnetic wave analysis the electromagnetic fields are often as a complex spatially varying amplitude multiplied by a phase term that expresses both the accumulation of complex phase with time and propagation distance. For a mode propagating in the z direction at optical frequency $\omega$, the phase term is represented by $\exp(i\omega t - i\beta z)$ where $\beta$ is known as the propagation constant. This formalism simply quantifies the accumulation of phase upon propagation. It is useful to define a normalized propagation constant that is normalized by the frequency $\omega$. This quantity ($\beta/\omega$) is known as the normalized propagation constant or the effective refractive index ($n_{eff}$), or simply the effective index.

In many optical process that involve multiple modes, it may be important that these modes propagate together or "in phase". For modes in coupled waveguides, this implies that the modes have identical effective indices if they are to remain in phase during the interaction. To calculate the effective indices, one may employ a large number of methods which typically involve the solution of either a scalar or vector form of Maxell's equations. For simple systems the modes may be derived analytically, but in most cases one must resort to computation to find the modes of the optical system. The various computational techniques (finite-difference time-domain, beam propagation, plane-wave solvers, finite element method, method of lines, etc) typically involve iterative routines which return the eigenvalues and eigenvectors. The eigenvectors are the spatially varying field amplitudes of the optical modes and the eigenvalues are be the allowed propagation constants for a given optical frequency. Thus the effective indices can be obtained by dividing the modal propagation constants by the optical frequency.

Specific details will now be set forth with respect to example embodiments depicted in the attached drawings. It is noted that like reference numerals refer to like elements.

FIG. 1 shows a lighting emitting device 100 in accordance with an example embodiment. The light emitting device 100 may be a portion of an OLED structure or a light source as mentioned previously. As will become clearer as the present description continues, the device 100 represents only a portion of a pixel or a portion of a light source. The device 100 includes a substrate 101 over which a passive waveguide 102 is disposed. A smoothing (or buffer) layer 103 is disposed over the passive waveguide 102 and has an anode 104, an active layer 105, and a cathode 106 disposed thereover. An active waveguide is comprised of the anode 104, the active layer 105 and cathode 106. Finally, an encapsulation layer 107 is disposed over the active waveguide.

In accordance with an example embodiment, the device 100 may emit light through the substrate 101 (i.e., bottom emitting), in which case the anode 104 is substantially transparent to light of the emission wavelength range. In this example embodiment, the anode 104 may include indium tin-oxide (ITO) or other suitable conductive material. In another example embodiment the device 100 may emit light through a transparent or semi-transparent cathode 106 and encapsulating layer 107. In this embodiment, the device is top-emitting.

In either the top emitting or bottom emitting structures, the substrate 101 may be glass typically used in lighting or display applications. For purposes of illustration and not limitation, the glass may be a transparent glass plate such as that manufactured and sold by Corning Incorporated under the brand names of Code 1737 glass or Eagle 2000™ glass. Alternatively, the substrate plate 101 may be a transparent glass plate such as those manufactured and sold by the companies such as Asahi Glass Co. (e.g., OA10 glass and OA21 glass), Nippon Electric Glass Co., NHTechno and Samsung Corning Precision Glass Co.

The smoothing layer 103 disposed over the passive waveguide 102 functions as a cladding layer in the coupled waveguide structure. In addition, the smoothing layer 103 provides electronic benefits to the device 100. To this end, the active layer 105 may be comprised of a plurality of relatively thin light emitting materials, such as organic light emitting materials. These light emitting materials separate the cathode and anode, which supply the charge carriers required for light emission. However, because the active layer 105 is relatively thin, the substrate over which the active layers are formed must be exceedingly smooth. (For example, acceptable surface roughness for a substrate is normally less than approximately 3.0 nm rms.) Because unacceptable surface roughness can result in shorting of the electrodes across the active layer. In order to address this, the smoothing layer 103 is provided.

In the present example embodiment, the core for the active waveguide 105 includes one or more organic layers and the anode 104. The asymmetric cladding comprises the smoothing layer 103 and the cathode 106. The anode 104 is adjacent to the light extraction region and is substantially transparent in bottom-emitting devices but is reflective in a top-emitting design. In the present example embodiment, the active layer(s) between the two electrodes comprises typical OLED layers, which include a hole injection layer, a hole transport layer, emission layer(s), an electron transport layer, and an electron injection layer. The cathode 106 can be a standard metallic cathode, a Black Layer™ cathode or a semitransparent cathode. As is well-known, these transport layers and organic layers are made relatively thick to prevent shorting. Moreover, as described more fully herein, the thickness of the core and cladding layers as well as their material properties are chosen to foster efficient coupling of light between the active and passive waveguides.

In operation, light originates in the active layer 105 and is coupled to the passive waveguide 102 and surrounding layers. Thus, a coupled mode 108 is supported by the active and passive waveguides via the selection of the materials and their thickness as described more fully herein. The coupled mode 108 has a characteristic length, known as the coupling length. The coupling length is defined as the propagation distance required for the mode to be coupled from one waveguide to another waveguide and back to the first waveguide. The coupling length is determined by the waveguide geometry, waveguide indices, wavelength and by the mismatch between the effective refractive indices of the coupled waveguide modes.

In example embodiments that relate to display devices it is useful for the coupling length to be less than the width of a pixel in order to ensure efficient light transfer to the passive waveguide 102, and thus efficient extraction of the light from the passive waveguide 102. In fact, it is useful for the coupling length to be significantly less than the pixel width or other relevant dimension. In example embodiments, the coupling length is less than approximately 50 μm. In other example embodiments, the coupling length may be approximately 20 μm. Compared to a typical pixel width, which is on the order of approximately 100 μm, such coupling lengths are acceptable.

Beneficially, example embodiments provide the light generated by the OLED layers the opportunity to interact with the light extraction features many times. In order to efficiently extract the light, a relatively short coupling length and a distributed extraction features are used. If the light extraction features are discrete, the light many not interact with a feature before it is absorbed in the surrounding device structure. However, it is useful to have pixel placement that is non-periodic or is periodic with a period that is not commensurate with the coupling period.

Illustratively, the example embodiments incorporate coupled waveguides to physically remove function from the light emission (e.g., organic) region to a neighboring passive waveguide. This neighboring waveguide is separated from the active waveguide by the buffer/smoothing layer 103 having an index of refraction that does not need to be as great as (or greater than) the index of refraction of the active layer (for example, greater than approximately 1.8 for organic materials). This freedom to use lower index materials allows the use of an optical polymer materials (having, for example, an index of refraction of approximately 1.5 to approximately 1.6) for smoothing layer 103. Moreover, and as described more fully herein, depending on the nature of the light extraction feature much of the passive waveguide 102 may act as a buffer or smoothing layer, which benefits the electronic performance of the active layer 105.

Figure 2:
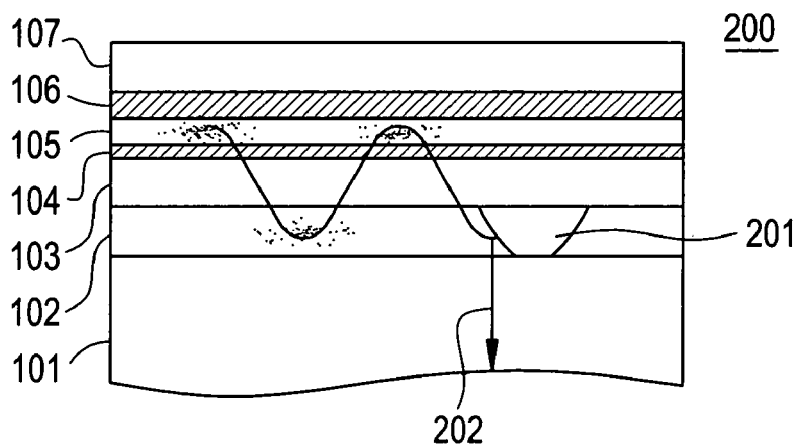
FIG. 2 is a partial cross-sectional view of waveguide, including an active light emitting layer, coupled to another waveguide in accordance with an example embodiment.

FIG. 2 is a partial cross-sectional view of a device 200 in accordance with an example embodiment. The device 200 shown in FIG. 2 is substantially the same as device 100 shown in FIG. 1. As such, duplicative details are omitted so as to avoid obscuring a description of the present example embodiments. However, it is noted that the device 200 includes a reflective structure 201 at a location along the passive waveguide 102. This reflective structure 201 is illustratively a mesa having an angular orientation relative to the direction of propagation of the coupled mode 108. Accordingly, light of the coupled mode is reflected from the reflective structure 201 in a direction substantially perpendicular to the propagation direction of the coupled mode; namely through the substrate 101 and out of the bottom surface of the device 200. In an example embodiment, the reflective structure 201 is a mesa made of a material producing high reflectivity. Illustratively, the reflective structure 201 comprises a metal such as gold, silver or aluminum.

The reflective structure 201 can be formed as a mesa by first depositing the material for the passive waveguide, followed by photolithographic patterning of the mesa via reactive ion or wet chemical etching. This patterning would then be followed either by a patterned metal deposition which could be accomplished via lift-off, shadow masking or reactive-ion etching.

The reflective structure 201 is useful in extracting the light from the coupled waveguides and thus the device 200. In order to properly extract light from a pixel, a plurality of pixels, or lighting structures, a plurality of such reflective structure would be incorporated into the device 200. Moreover, where the device 200 is used in display applications, the placement of the reflective structure 201 requires certain considerations. For example, light from the active layer 105 of one pixel is emitted all along the length of the active layer (recall that the device 200 may be less than one pixel in length). As such, it is possible that the light of the coupled mode is not efficiently reflected from the reflective structure. For instance, the light may be mostly in the active waveguide at the point of the reflective structure. In this case, virtually none of the light would be reflected from the coupled passive waveguide. This light may traverse the coupled waveguides and be reflected at a distance from the reflective structure 201 by another reflective structure (not shown). Furthermore, this light may be reflected in a region of another pixel, and may thus result in pixel distortion. Accordingly, it may be useful to have a plurality of reflective structures, and to separate them at non-periodic distances relative to the coupling length.

Figure 3A:
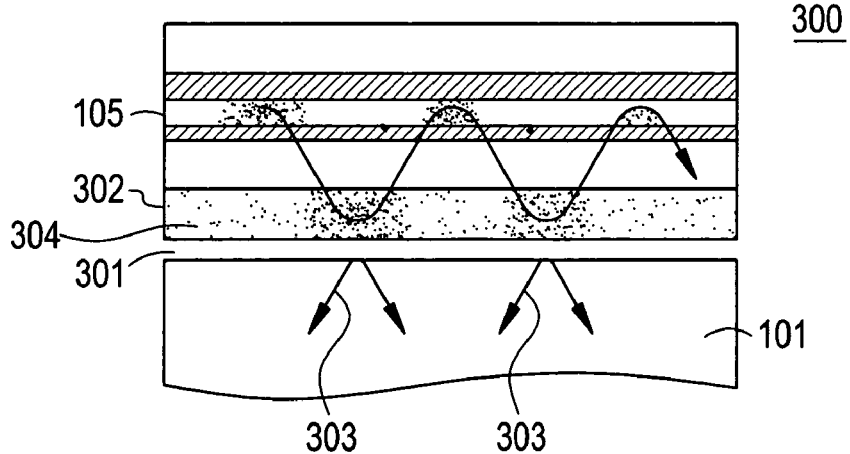
FIG. 3a is a partial cross-sectional view of waveguide, including an active light emitting layer, coupled to another waveguide in accordance with an example embodiment.
Figure 3B:
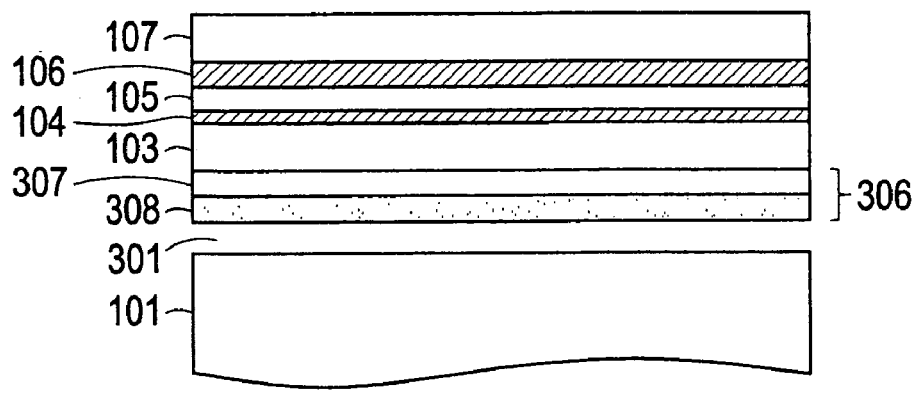
FIG. 3b is a partial cross-sectional view of waveguide, including an active light emitting layer, coupled to another waveguide in accordance with an example embodiment.

FIGS. 3a and 3b are partial cross-sectional views of light emitting devices 300 and 305, respectively. The devices 300 and 304 share common features with one another and with the devices of FIGS. 1 and 2. Descriptions of common features are not duplicated so as to not obscure the description of the present embodiments. The device 300 includes a passive waveguide 302 with a plurality of scattering (reflective) sites 304. The passive waveguide 302 is coupled to the active waveguide 102 as described above, but includes the scattering sites 304 that reflect light 303 along the length of the passive waveguide 302. As such, the concerns of the light's being reflected over the location of another pixel are substantially moot in view of the plurality of scattering sites.

The scattering sites 304 may be either diffuse or specular reflectors. For example, the scattering sites 304 may be specular reflectors such as reflective structures 201 described in connection with the example embodiment of FIG. 2. Specular scattering may lead to higher efficiency because the scattering angle can be chosen such that the scattered light is within the escape cone of the interface between the glass substrate and air. However, specular scattering may also lead to an angular dependence in the light extraction.

Examples of diffuse scatterers include phase separated mixtures of optically transparent glasses or polymers in which the components have different refractive indices. The degree of scattering increases with greater differences between the refractive indices of the components. Furthermore, an efficient scatterer can be made using a phase-separated material in which one of the phase-separated components is a void which may contain a vacuum, air or other gas. Techniques for making such materials are well-known and example processing techniques are sol-gel methods, soot-based glass fabrication methods (such as outside vapor deposition), tape casting, and chemical leaching. One practiced in the art would recognize that this list is not exhaustive.

Diffuse scattering will lead to a more isotropic angular distribution of light extraction but may be less efficient due to absorption over the longer mean free scattering length, and because some of the light will be scattered to angles that will remain trapped within the glass substrate.

In an example embodiment in which the scattering sites are embedded in the passive waveguide, the refractive index of the passive waveguide material is chosen so the effective refractive index of the passive waveguide mode substantially matches the effective refractive index ($n_{eff}$) of the active waveguide mode. The exact value of $n_{eff}$ is determined by the wavelength of light, the refractive indices and thicknesses of the layers (e.g., layers 103, 104, 105 and 106) forming the active waveguides. Illustratively, $n_{eff}$ is approximately 1.4 to approximately 2.0, or more typically approximately 1.5 to approximately 1.8.

The passive waveguide 302 may be formed from a variety of glasses, polymers, glass ceramics or phase-separated mixtures of polymers, glasses and glass ceramics. Additionally, the passive waveguide 302 may be a matrix material having voids. The voids provide beneficial scattering sites for light extraction. Illustratively, the passive waveguide with scattering sites and a relatively high refractive index (refractive index greater than 1.7) is a porous zirconia film such as formed by a known tape-casting method.

In addition to the benefits of the plurality of scattering sites 304 in the passive waveguide 302, the device 300 includes an air gap 301 between the passive waveguide 302 and the substrate 101. The air gap has an index of refraction of approximately 1.0. As such, light that is transmitted through the air gap and is refracted at the surface of the glass will be transmitted through the glass and will be refracted again in the air at its angle of incidence to the glass originally. Thus, the light 303 will be emitted from the bottom of the device. As can be readily appreciated, the air gap 301 provides a window pane effect, and thus prevents substantially any light from being totally internally reflected at the lower external surface of the substrate 101 (i.e., the bottom of the device 300).

In addition to improving output efficiency, the air gap 301 significantly reduces if not substantially eliminates TIR, and thus helps to reduce pixel blurring. To wit, without the air gap 301, light reflected by TIR may be coupled in the coupled waveguide structure of the device 300, propagate to a point adjacent a neighboring pixel and be reflected and emitted from the lower surface. This can easily blur the neighboring pixel to the viewer. Clearly, the significant reduction in TIR is beneficial for at least this reason.

In an example embodiment, the air gap 301 is introduced using spacers between the layer 302 and the substrate 101. The spacers may be formed by various techniques including a patterned etching of the substrate 101 or a patterned deposition of a polymer layer. A sacrificial layer is deposited followed by the deposition of the passive waveguide structure 302. The sacrificial layer could be removed at this point by patterning and etching, or could be removed after the deposition of subsequent layers of the device.

In an example embodiment, the air gap 301 is at least 100 nm. In another example embodiment, a material having an index nearly the same as that of air is disposed between the layer 302 and the substrate 101. For example, silica aerogels, which are known in the art, have an index of refraction of approximately 1.05 may be used. In an illustrative embodiment, the smoothing layer 103 is silica having a thickness of approximately 50 nm; the aerogel layer has a thickness of approximately 50 μm; and the active layer 105 has a thickness of approximately 100 nm. It is noted that the active layer may be approximately 50 nm in order to suppress TE modes in the waveguide.

Finally, it is noted that the use of the air gap 301 requires suitable sealing to prevent contamination of the device 300. The sealing is normally effected in OLED structures, and known sealing techniques may be used in OLED and embodiments with other active layer materials.

The device 305 of FIG. 3b includes many of the same features as FIGS. 1-3a. However, unlike the device of the example embodiment FIG. 3a, the lighting device 305 includes a passive waveguide 306 that includes a passive waveguide layer 307 and a scattering layer 308. The passive waveguide layer 307 is essentially the same as the passive waveguide 102, albeit illustratively less thick; and the scattering layer 308 is essentially the same as the scattering layer 302, again less thick. Of course, the thicknesses of the layers 307 and 308 are governed by the index matching criteria of the coupled mode, which are described in further detail herein. Finally, as described in connection with the example embodiment of FIG. 3a, light that is generated at the active waveguide 105 is coupled to the coupled waveguide 306; is scattered by the scattering layer 308 traverses the air gap 301, and is emitted from the bottom surface of the substrate 101.

Such an embodiment has the benefit of removing the scattering layer further away from the sensitive active layers of the OLED device.

Figure 4:
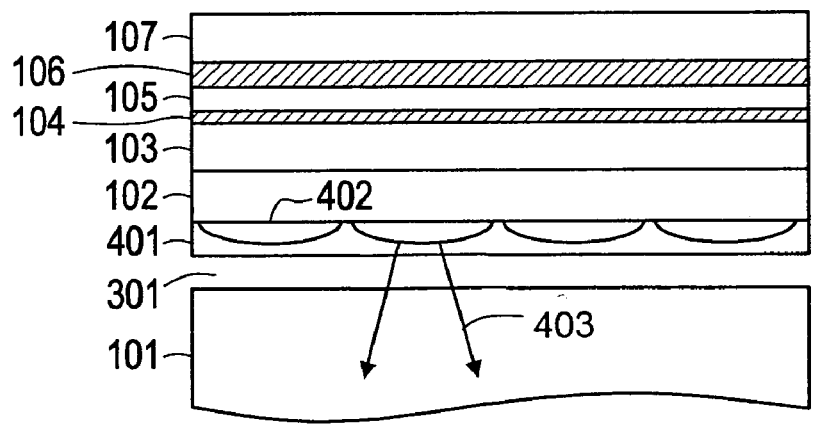
FIG. 4 is a partial cross-sectional view of waveguide, including an active light emitting layer, coupled to another waveguide in accordance with an example embodiment.

FIG. 4 is a partial cross-sectional view of a light emitting device 400 in accordance with an example embodiment. The device 400 has features common to those of the example embodiments of FIGS. 1-3b. Duplication of the description of these features is omitted so as to avoid obscuring a description of the present example embodiments. The passive waveguide 102 is coupled to the active waveguide comprised of the anode 104, the light emitting layer 105 and the cathode 106 as described previously. However, a microstructure array 401 is disposed beneath the passive waveguide, and includes a plurality of microlenses 402. In this manner, the coupled mode 108 may be transmitted from the microlenses as light 403. The light 403 is transmitted through the air gap 301 and then through the substrate 101.

The microlenses 402 may also be microspheres, and may be located in a non-periodic manner, or may be periodically located. Illustratively, the microlenses 402 are disposed at the air-glass interface, and change the angle of incidence of light. Thereby, the microlenses 402 significantly reduce TIR. Light that is reflected at the edges of the microlenses or where there are no lenses will be reflected by TIR and be again reflected by the cathode 106 to a different position on the array of microlenses 402, thereby aiding light extraction.

It is noted that among other benefits, the microlens array of the example embodiment of FIG. 4 substantially preserves polarization of light. This is useful in systems, which use polarization to control ambient-light rejection. Moreover, microlenses provide better control of the emission angle of light.

Microlenses 402 can be formed from glass or polymers including polymethylmethacrylates, polyvinylcarbazoles, polybutadienes, polyethylenes, and polyesters. Microlens arrays of low-temperature glasses and polymers can be formed by molding techniques. Other techniques include microlithography, etching, or like mechanical or lithographic means. The array of microlenses 402 may be or may not be periodic depending on whether the OLED application is sensitive to the possible angular dependence produced by a periodic structure. Spaces may be left between the individual elements in order to establish the coupled modes of the waveguides. The lenses then serve as disruptions of the passive waveguide that scatter light. In this case the refractive index of the microlenses 402 should be greater than or equal to that of the passive waveguide 102 and the spacing of the lenses should be chosen such that there is at least one lens or microstructure per unit coupling length. Alternatively, the density of the microlenses 402 in the array may be quite high as shown in FIG. 4. In this case the lenses themselves form part of the passive waveguide and their refractive index should be matched to that of the uniform part of the passive waveguide 102. In high-density arrays, the edges of the lenses act as scattering centers and lead to light extraction.

Notably, the microlenses 402 may be of a variety of geometries including, but not limited to, cross-sections that are circular, square, rectangular and hexagonal.

The individual microlenses 402 in the array are beneficially smaller than the pixel size with a dimension that is less than approximately 0.2 times the minimum pixel dimension but more than approximately 0.01 times to approximately 0.1 times the minimum pixel dimension. It is noted that the referenced dimensions of the microlenses of example embodiments are the transverse dimension of the microlenses 402 measured in the plane of the light emitting device device. For display applications the dimension of the lenses may be approximately 1 micrometers to approximately 20 micrometers with a 'sag' of between approximately 0.0 micrometers and 5 micrometers.

The microlenses 402 in the array need not have the same properties (diameter, curvature or spacing) but the design would be chosen to maximize external optical efficiency. As an alternative to microlenses other microstructures in an array may be used. These include, but are not limited to pyramidal or prismatic reflectors that deposited and arrayed in the manner described for the lens arrays.

Figure 5:
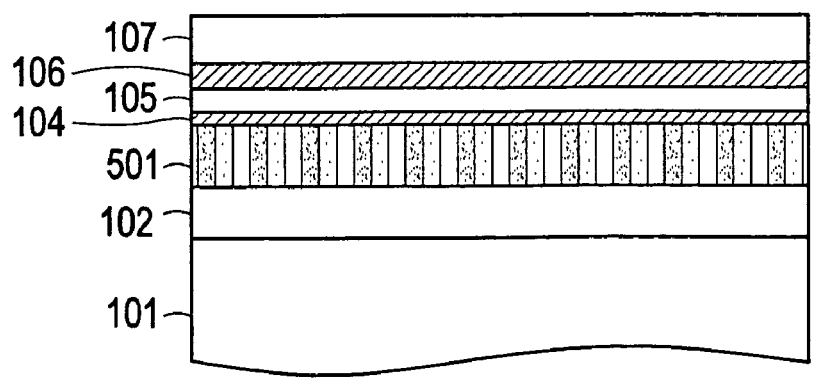
FIG. 5 is a partial cross-sectional view of waveguide, including an active light emitting layer, coupled to another waveguide in accordance with an example embodiment.

FIG. 5 is a partial cross-sectional view of a light emitting device 500 in accordance with an example embodiment. The light emitting device 500 has features common to those of the example embodiments of FIGS. 1-3b. Duplication of the description of these features is omitted so as to avoid obscuring a description of the present example embodiments. The device 500 includes an index modulated layer 501, which may be a periodic grating that is integral with the smoothing layer. As will become clearer as the present description continues, the grating of layer 501 enhances light extraction of light from the active layer 105 by enhancing the coupling of light between the active waveguide and the passive waveguide 102. In addition, the grating shortens the beat length of the coupled mode and allows for thicker smoothing layers. A modulated refractive index can be obtained by the photorefractive effect such as that commonly used to produce Bragg gratings in glass optical fibers using ultraviolet light. This effect may be enhanced by the inclusion of dopants such as germanium and hydrogen into the glass before exposure to ultraviolet light.

It is noted that the device 500 may include a light extraction structure such as those described in connection with the example embodiments of FIGS. 1-4.

Figure 6:
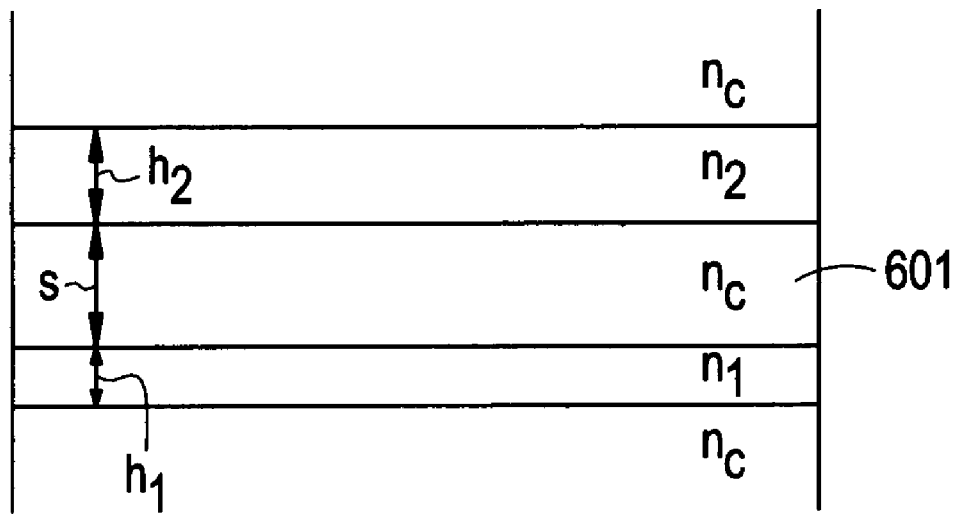
FIG. 6 is a partial cross-sectional view of a coupled waveguide in accordance with an example embodiment.
Figure 7:
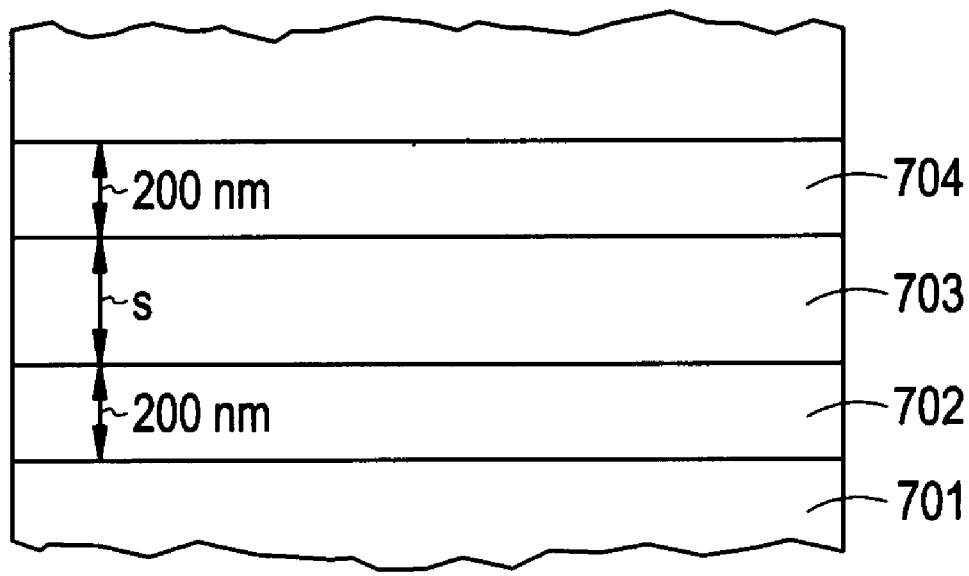
FIG. 7 is a partial cross-sectional view of a coupled waveguide in accordance with an example embodiment.

As is clear from the preceding description of example embodiments, coupled waveguides are useful in extracting light from light emitting devices, where the index of refraction of the light emitting material is greater than at least its nearest layer. The structures upon which the following formalism is based are shown in FIGS. 6 and 7.

Coupled waveguides are commonly used in planar optical circuits and in optical fiber devices. There is a very well developed formalism for the coupled mode theory of parallel waveguides that in the simplest case reduces to two coupled differential equations for the amplitudes $A_1$ and $A_2$ of the optical modes as a function of propagation distance z:

$$\frac{dA_1}{dz} = i\kappa A_2 e^{-2i\delta z} \qquad (1)$$

$$\frac{dA_2}{dz} = i\kappa A_1 e^{2i\delta z},$$

where $2\delta$ is the detuning or the difference between the propagation constants of the two modes:

$$2\delta = \beta_1 - \beta_2 = 2\pi(n_{\textit{eff}1} - n_{\textit{eff}2})/\lambda \qquad (2),$$

where $n_{\textit{eff}1}$ is the effective index of the first mode, $n_{\textit{eff}2}$ is the effective index of the second mode, and $\kappa$ is the coupling coefficient calculated from the geometry and wavelength. The basic structure is shown in FIG. 6. If light is introduced into the waveguide mode of waveguide 1 the power will couple into waveguide 2 according to:

$$|A_2(z)|^2 = \frac{\kappa^2}{\kappa^2 + \delta^2} \sin^2\left(\sqrt{\delta^2 + \kappa^2}\, z\right). \qquad (3)$$

For identical waveguides, δ=0 and the power couples back and forth with 100% efficiency. For nonzero δ, the efficiency, η, is given by:

$$\eta = \frac{\kappa^2}{\kappa^2 + \delta^2}, \qquad (4)$$

and this function is maximized for κ>>δ. For a buffer layer 601 of thickness s, it can be shown that κ is proportional to:

$$e^{-k\sqrt{n_{\it eff}^2 - n_c^2}\, s}, \qquad (5)$$

As can be appreciated, the decreasing exponential relation of Eqn. 5 is due to the evanescent tails of the electromagnetic fields in the medium. Eqn. 5 indicates that the coupling is strongest for small buffer thickness, s, or for an index $n_c$ of layer 601 that is close to the effective index of the modes guided in the waveguides. It is noted that the above analysis is only valid for geometries in which the electromagnetic fields of one waveguide do not significantly overlap with the structure of the second waveguide. Even with this caveat, the general trends indicated here are still of value for determining the factors that affect the design.

An OLED device is broadband even when it is a single color OLED. For example, a red OLED has a bandwidth of approximately 50 nm to approximately 100 nm. Eqns. 2 and 4 require that the effective indices of the passive and active waveguides be approximately matched over that entire bandwidth. If they are not matched (i.e. □ does not equal zero) the efficiency will decrease in a manner given by Eqn. 4. If an efficiency, η, is required to be greater than approximately 50%, the geometry and materials are chosen to have a coupling coefficient κ>δ. However, lower efficiencies may be acceptable if light can couple back and forth between the waveguides many times within one pixel. This gives the trapped light many opportunities to interact with the light extraction mechanism. The coupling length $Z_c$ is given by:

$$z_c = \frac{\pi}{2\sqrt{\kappa^2 + \delta^2}} = \frac{\pi\sqrt{\eta}}{2\kappa} \qquad (6)$$

As can be appreciated, Eqn. 6 indicates that lower efficiencies naturally lead to short coupling lengths.

The above formalism is only for lossless waveguides with symmetry. Using known techniques, simulations of a lossy, metal-clad OLED geometry using beam propagation and finite difference time domain modeling tools may be effected. The geometry for these calculations is shown in FIG. 7, which includes an ITO waveguide 700. Of course, the geometry of FIG. 7 share many common features with the devices of FIGS. 1-4, and thus the present formalism is applicable to these illustrative embodiments as well.

The ITO waveguide 700 includes a substrate 701, a passive waveguide 702, a buffer layer 703 and a cathode layer 704 that are substantially the same as those described in connection with the example embodiments of FIGS. 1-5. Illustratively, the substrate 701 is glass; the passive waveguide 702 is a layer of an optically transparent polymer or optically transparent glass having an index of refraction of approximately 1.662 or approximately 1.656 and a thickness of approximately 200 nm. The smoothing layer is a layer of optically transparent polymer or optically transparent glass having an index of refraction of approximately 1.5 to approximately 1.6 and a thickness 's.' The organic/ITO layers 705 is simplified by just using the refractive index of ITO, which is approximately 1.779. The absorption of the active waveguide is also modeled in the calculation. The layer 705 has a thickness of approximately 200 nm. Finally, the cathode 704 (cladding layer) is illustratively aluminum.

Initially, the ITO waveguide 700 is isolated by using a thick buffer layer and the effective index of the mode was calculated using the beam propagation method. Then the passive waveguide 702 was isolated and its material refractive index is modified until the effective index of its mode matched that of the ITO waveguide. Then the two waveguides are brought together with a buffer layer 703 of varying thickness. The present analysis was done for two smoothing/buffer layers 703 of differing indices.

Figure 8A:
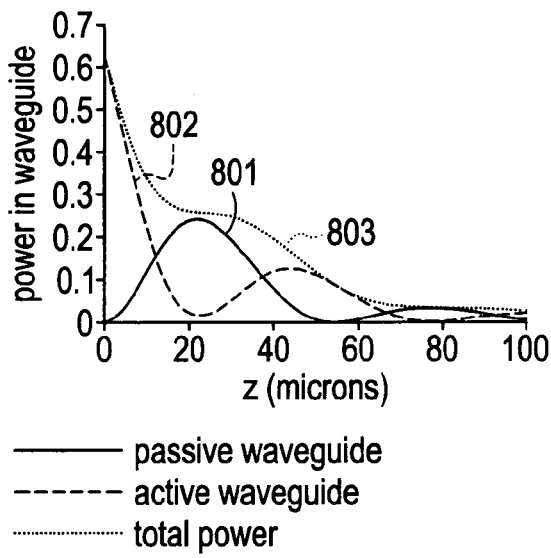
FIGS. 8a and 8b are graphical representations of the optical power versus propagation length of coupled waveguides in accordance with example embodiments.
Figure 8B:
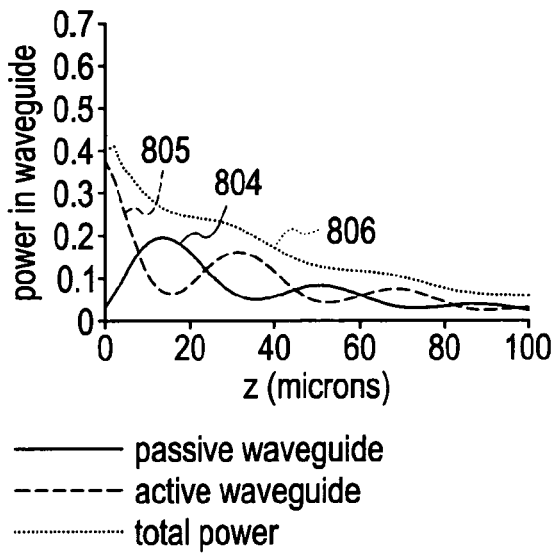

The optical power in the core region of each of the waveguides is measured as a function of propagation distance z. These results are shown in FIGS. 8a and 8b. To this end, in keeping with example embodiments, oscillations of optical power in the core of the lossless passive waveguide (curve 801) and the core of the lossy active waveguide (curve 802) are separated by a buffer with index n=1.5 and s=500 nm. It is noted that the total power (curve 803) in both cores drops in a stepwise fashion with very little power lost while the light is in the lossless passive waveguide.

FIG. 8b shows the power versus propagation distance with a buffer index of n=1.6 and s=500 nm. The oscillations of optical power in the core of the lossless passive waveguide (curve 804) and the core of the lossy active waveguide (curve 805) are shown. In this embodiment, the total power (curve 806) is less because more of the light is carried in the cladding surrounding each waveguide. Also, the isolation is no longer as efficient because the coupling is so strong that the coupled-mode analysis breaks down. It is also noted that the beat length is shorter for the higher index buffer.

As referenced, FIG. 8a shows that the power oscillating back and forth between the passive (curve 801) and active waveguide (curve 802) cores. The total power (curve 803) is stair-stepped because the system is only lossy when the light is in the metal-clad ITO waveguide. A coupling length, $Z_c$, on the order of 20 μm is obtained. If the buffer index is increased to n=1.6 the coupling length decreases to 15 μm because the waveguides are more strongly coupled. In fact, the waveguides of the present example are so strongly coupled that they can no longer be treated as isolated waveguides and the coupling is no longer 100% efficient. But as noted earlier, 100% efficiency is not required for the invention to provide significant improvements in light extraction.

Figure 9A:
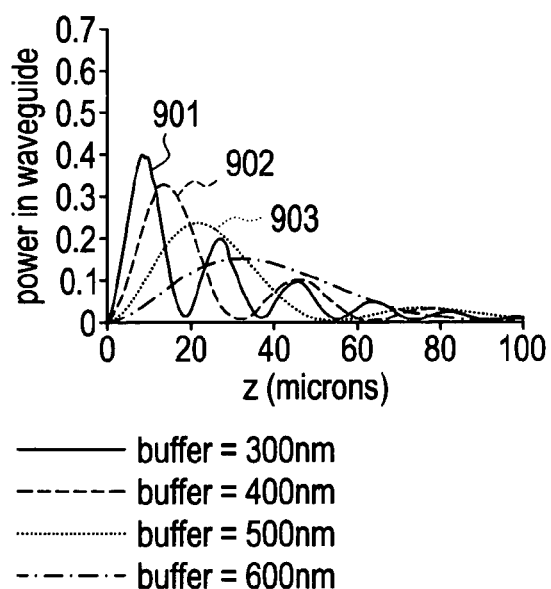
FIGS. 9a and 9b are graphical representations of the optical power versus propagation length of coupled waveguides in accordance with example embodiments.
Figure 9B:
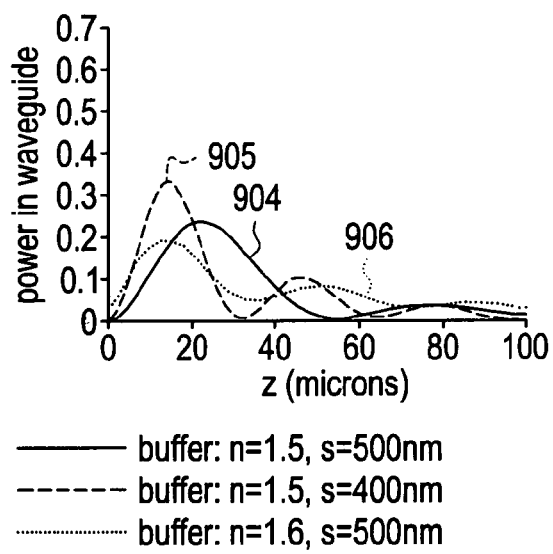

FIGS. 9a and 9b are graphical representations of the optical power of passive waveguide versus propagation distance in accordance with other example embodiments. FIG. 9a is a graphical representation comparing various buffer thicknesses for a buffer index of n=1.5. To wit, the coupling length is seen to be approximately 20 microns for a 300 nm buffer thickness (curve 901), increasing to 32 microns for a 400 nm buffer thickness (curve 902), and further to 54 microns for a 500 nm buffer thickness (curve 903). It is further noted that as the coupling constant decreases with increasing buffer thickness, the beat length of the oscillations increases.

FIG. 9b shows that the buffer thickness can be increased to s=500 nm in a buffer having an index of refraction of 1.6 (curve 906) while maintaining the same beat length as the thinner n=1.5 buffer (curve 905). Curve 904 shows the optical power versus propagation distance with the index of refraction of the buffer's being 1.5 and the thickness of the buffer's being s=500 nm.

The gain comes at the expense of overall efficiency. The coupling length varies considerably as would be expected from Eqns. 5 and 6. Beneficially, the smoothing layer is thick enough for smoothing purposes yet thin enough to provide high coupling. For example, FIG. 9b shows the impact of buffer index on coupling length.

Figure 10:
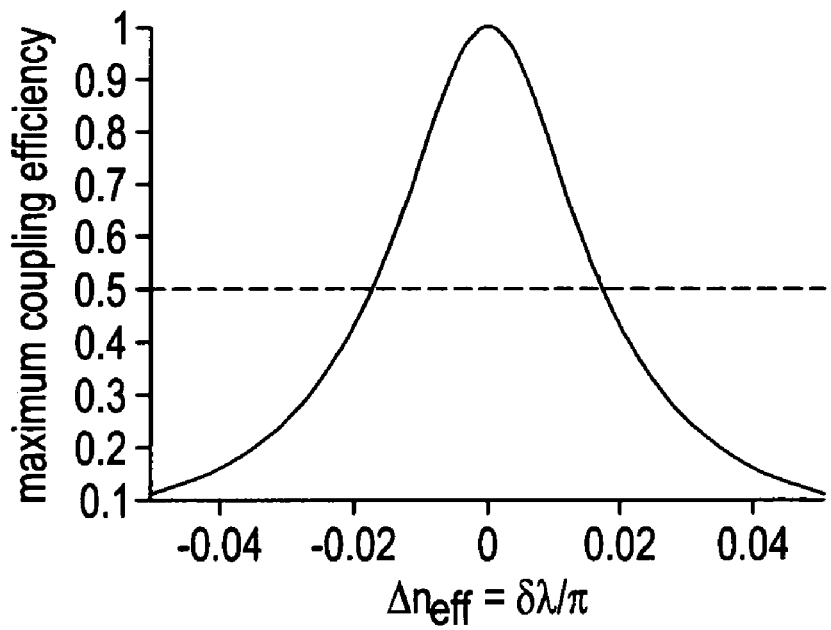
FIG. 10 is a graphical representation of the maximum coupling efficiency versus change in index of refraction ($\Delta n_{eff}$) in accordance with example embodiments.

From FIG. 9b and Eqn. 6, the propagation constant, κ, can be determined assuming δ=0. A 400 nm buffer with a coupling length of 15 μm yields: κ=0.1 μm$^{-1}$. The bandwidth of the coupled waveguides can be estimated by requiring that the efficiency, η, of Eqn.4 remain greater than 50%. In FIG. 10, a graph of the maximum coupling efficiency versus $\Delta n_{eff}$ in accordance with an example embodiment, the efficiency versus $\Delta n_{eff}$ is shown. To wit, FIG. 10 shows the operational bandwidth of a coupler of an example embodiment having a propagation constant of 0.1 μm$^{-1}$ at λ=550 nm. To maintain at least 50% coupling efficiency, $\Delta n_{eff}$ must remain less than approximately 0.02. The data for the graph of FIG. 10 are determined using Eqns. 2 and 4. As can be readily appreciated from the present description, it is useful to provide a structure where $n_{eff}$<0.02. Of course if the material dispersion for the passive waveguide is chosen to match the dispersion of the ITO/organic/cathode waveguide, this condition can be more easily met.

The formalism described previously can be applied to model grating-assisted coupled waveguides such as of the example embodiments of FIG. 5. One benefit of using a grating is that the waveguides no longer have to have substantially the same effective index however it significantly narrows the operating bandwidth of the coupled waveguide device. With a grating of period Λ and using the first order diffraction from the grating, EQN. 2 now becomes:

$$2\delta=(\beta_1-\beta_2)-2\pi(n_{eff1}-n_{eff2})/\Lambda=2\pi(n_{eff1}-n_{eff2})\lambda-(2\pi/\Lambda) \quad (7)$$

Typically the effective indices are not too different and so the grating has a very large period compared to the wavelength. As described previously, in many applications it is useful for the period Λ be significantly less than the pixel size so perhaps less than approximately 5 μm. From Eqn. 7 this translates to $\Delta n_{eff}$=λ/Λ or Δneff>0.1. At 550 nm the effective index is 1.561 for the active waveguide with a smoothing layer with n=1.5. It is noted that it may be difficult to fabricate a waveguide with an effective index of 1.461 to yield $\Delta n_{eff}$=0.1 if the buffer/smoothing layer has index of refraction of n=1.5. In the blue wavelength portion of the optical spectrum where indices of refraction of the organic material (light emitting layer) and ITO are larger (where n is approximately 1.9), the effective index of the active waveguide will be higher so it might be feasible to achieve $\Delta n_{eff}$=0.1. Alternatively, higher order diffraction gratings may be used. Still alternatively, multiple gratings may be used.

Figure 11:
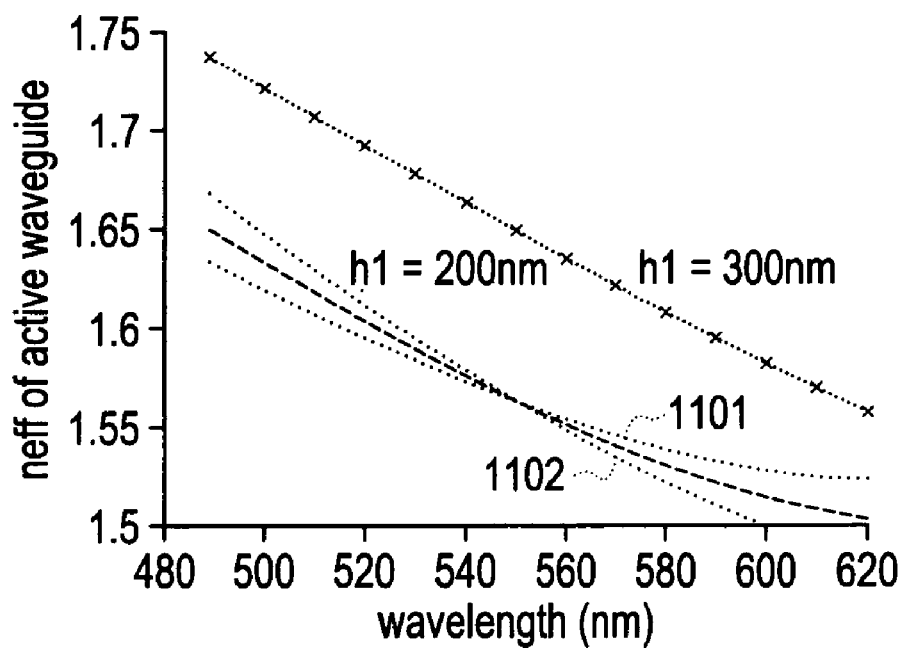
FIG. 11 is a graphical representation of the effective refractive index of the active waveguide versus wavelength in accordance with an example embodiment.

FIG. 11 is a graphical representation of $n_{eff}$ of an active waveguide versus wavelength in accordance with an example embodiment. The graph shows the strong dispersion of the active waveguide mode for two different waveguide thicknesses. Any passive waveguide will have to match this dispersion to within approximately 0.02. In the example embodiment of FIG. 11, the wavelength dependence of the effective index of the mode of the metal-clad active waveguide (ITO in this embodiment) for two waveguide widths for a buffer index of n=1.5. Curves 1101 and 1102 represent possible choices for the required $n_{eff}$ of the passive waveguide to stay within the $\Delta n_{eff}$ that is less than approximately 0.02 in keeping with the example embodiments.

In addition to the embodiments described, other embodiments comprise a multicolor OLED device such as those used in color display devices. Most OLED designs employ a structure in which the red, green and blue pixels are separate OLED devices deposited in separate deposition or printing steps. To enable a full-color OLED device with the coupled-waveguides of the example embodiments, the thickness of the passive waveguide can be different in the red, green and blue pixels. From FIGS. 11 and 13 it is apparent that the thickness of the passive waveguide can be used to compensate for the difference in $\Delta n_{eff}$ caused by a mismatch in material dispersion. Varying the thickness of the passive layer may be simpler to implement than varying the passive materials of the different color pixels, or than matching material refractive index of a single passive layer material over the entire visible spectrum.

Figure 12:
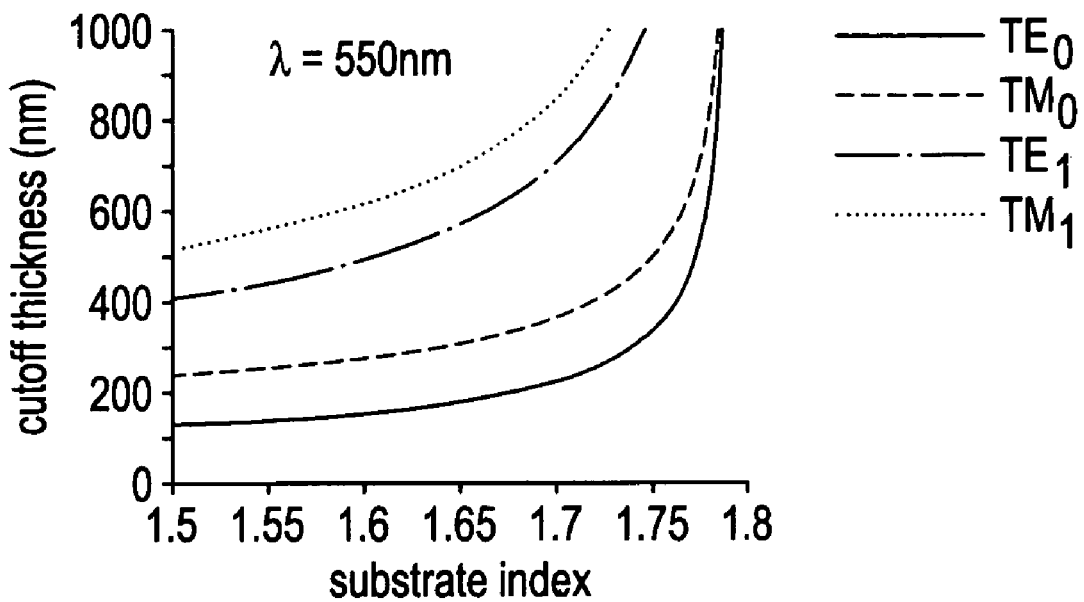
FIG. 12 is a graphical representation of the cutoff thickness versus substrate index of refraction in accordance with an example embodiment.

Polarization is a factor that often must be addressed in many display systems. However, because of the asymmetric cladding of example embodiments, it is possible to design the active waveguide with only TE modes. This can be done by making the active waveguide thinner than the TM cutoff thickness as shown in FIG. 12. It is possible to reduce the thickness even further but this requires an OLED thickness of less than approximately 120 nm, which may be too thin for optimal electrical and optical properties. If the TM modes cannot be cut off, the waveguides need to couple TE and TM couple across the smoothing (buffer) layer.

Beneficially, it is useful to make the active layer thin enough to cut off both TE and TM modes. This is rather difficult because of other constraints on layer thicknesses. However, another example embodiment provides coupled waveguides where the active waveguide is significantly thin to support only TE modes. This waveguide is then coupled to an asymmetric passive waveguide that is very close to the TE mode cutoff. This passive waveguide mode can then be easily stripped out by a low-index light extractor on the substrate side. This is possible because a mode close to cutoff will extend well beyond the waveguide core into the cladding. This example embodiment may be effected via the structure of the example embodiment of FIG. 3b, where the passive waveguide 306 is relatively thin. In this embodiment, the index of refraction of the scattering layer 308 is relatively low and the scattering layer 308 is a cladding layer adjacent to the air gap 301 and substrate 101. In this example embodiment the a passive waveguide 307 having a thickness of 100 nm of refractive index 1.8 can be coupled to an active/ITO waveguide (comprised of layers 104, 105 and 106) 250-nm thick across a buffer layer 103 of refractive index 1.5. The light extraction is effected using a low-index scattering layer 308 of refractive index 1.6.

Figure 13:
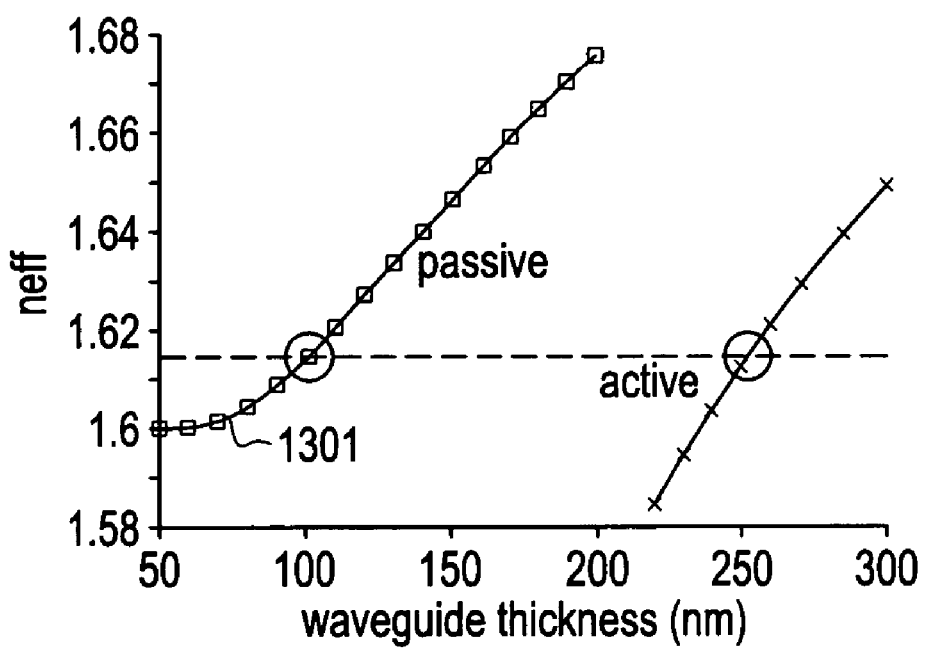
FIG. 13 is a graphical representation of the effective refractive index versus waveguide thickness in accordance with an example embodiment.

FIG. 13 is a graphical representation of the effective index of refraction versus waveguide thickness and provides design parameters for a coupled waveguide system, such as that of the example embodiment of FIG. 3b. The passive waveguide is asymmetric in order to provide TE mode cutoff. As such, the substrate 101 has a higher index of refraction than that of the smoothing layer 103. Beam propagation simulations based on designs from FIG. 13 show substantially the predicted behavior with the mode in the passive waveguide extending well into the cladding as the design includes thinner and thinner passive waveguides. In accordance with an example embodiment, the coupled waveguide has an ITO active waveguide, a buffer with n=1.5, a substrate of n=1.6 and a second waveguide of n=1.8. The high-index substrate of the present example embodiment provides the asymmetric passive waveguide (that can exhibit modal cutoff) and the high index in the passive waveguide is useful to match $n_{\mathit{eff}}$ of the two waveguides. The widths of the waveguides are substantially free parameters. The curving (e.g., at 1301) of the passive waveguide at relatively small widths is an indication that the mode is becoming cut off and escaping from the waveguide. As an example design, we would want a width for the passive waveguide of 100 nm and a width of the matching active waveguide of 251.5 nm giving an effective index in both waveguides of 1.61448.

If the passive waveguide is not asymmetric this desired behavior can be achieved by making the passive waveguide a very low-index-contrast waveguide or by making the waveguide very thin. Either of these solutions would cause the tails of the guided light to extend well into the cladding where a light extractor, such as those described in connection with example embodiments may be disposed.

Figure 14:
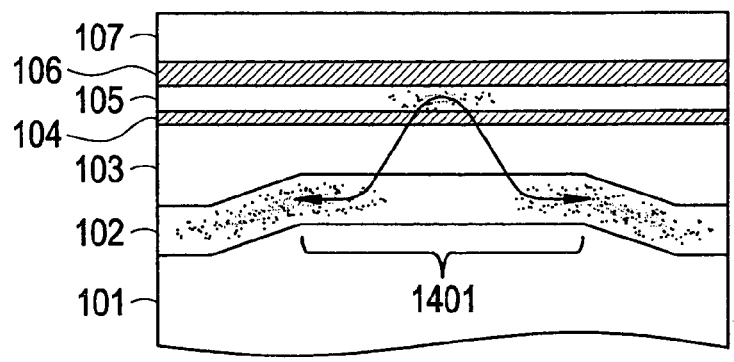
FIG. 14 is a partial cross-sectional view of a waveguide, including an active layer, coupled to another waveguide in accordance with an example embodiment.
Figure 15:
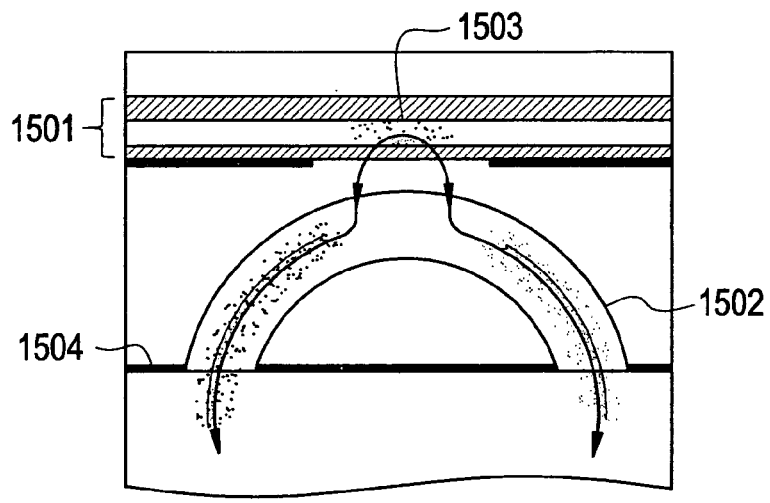
FIG. 15 is a partial cross-sectional view of a waveguide, including an active layer, coupled to another waveguide in accordance with an example embodiment.

FIG. 14 is a cross-sectional view of a light emitting device 1400 in accordance with another example embodiment. In the present embodiment, light is coupled into a passive waveguide 102 from the active waveguide comprised of the anode 104, the active layer 105 and the cathode 106, and travels to a region where the coupling constant is changed. Illustratively, the light is only extracted into the passive waveguide 102 in the region 1401 where the waveguides are closest. After the waveguides separate the light will remain in the passive waveguide. In the present embodiment, the region is realized via a physical taper. Alternatively, changes to the coupling coefficient between the passive and active waveguides could be made to effect this selective extraction. For example, the effective index of one of the waveguides could be changed periodically thus destroying the phase-matching condition. Alternatively, another layer (not shown) could be introduced between the waveguides to isolate them from each other. This layer could be a layer of thin film transistors (TFTs), for example. In order to extract the light the passive waveguide may include a scatterer, grating, periodic structure mesa or other extraction feature described in connection with example embodiments previously may be used. The device 1400 of the example embodiment of FIG. 14 is an attractive approach because it allows an active layer to guides all of the emitted light, which is then extracted through a coupled passive waveguide that redirects the light out of the device. Such a device is shown in FIG. 15. This avoids the incompatibility of scattering and ambient light rejection and could provide very high contrast displays.

In the example embodiment of FIG. 15, an active OLED waveguide 1501 is coupled to a curved light extraction waveguide 1502. The light is coupled at only one point (1503) and is extracted from the device via the curved passive waveguide(s) 1502. A masking layer 1504 (e.g., TFT layer) is included to improve image contrast by blocking the high reflector to ambient light. It is necessary to trap substantially all of the emitted light so that all of it is extracted in this way. Otherwise the masking layer will block the normally emitted light. Alternatively the structure could be made without the masking layer and could rely on circular polarizers to block ambient light.

The preceding example embodiments have illustrated bottom-emitting OLED configurations in which the light is extracted through the relatively thick substrate. Top-emitting designs may be useful in avoiding the blocking of light emission by the electronic layers of thin-film transistors (TFTs) required for high-resolution displays.

Figure 16:
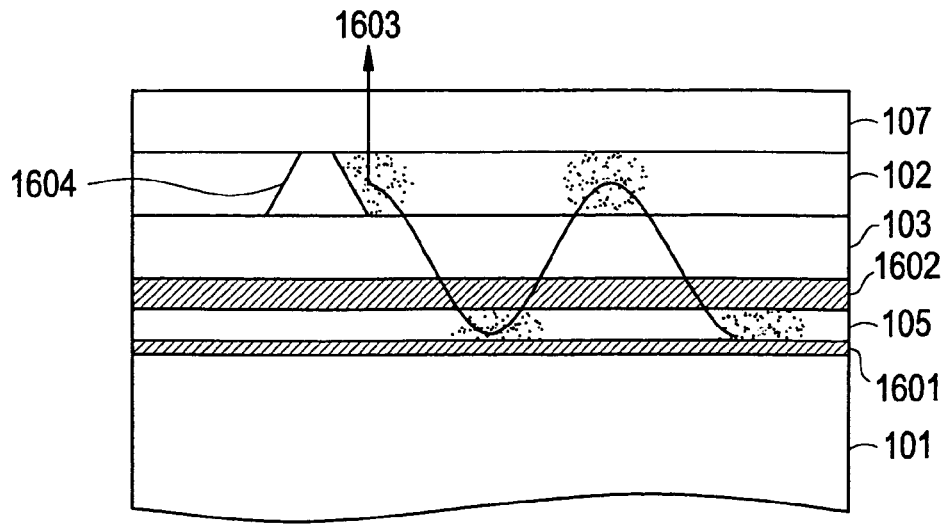
FIG. 16 is a partial cross-sectional view of waveguide, including an active light emitting layer, coupled to another waveguide in accordance with an example embodiment.

FIG. 16 is a partial cross-sectional view of a top-emitting OLED in accordance with an example embodiment. As with other example embodiments thus far described, there are features previously described that are common to the features of the example embodiment of FIG. 16. Such common features are often not repeated.

In the top-emitting OLED of FIG. 16, the TFTs (not shown) are placed behind the highly reflective anode 1601 and do not interfere with the light emission 1603 through the transparent cathode 1602. The coupled-waveguide design is modified from the bottom-emitting configuration by placing the passive waveguide 102 and buffer/smoothing layer 103 on the other side of the active waveguide, between the cathode 1602 and the encapsulation layer 107. Extending the light extraction features described for bottom-emitting configurations to the top-emitting design shown in FIG. 16 will be apparent to one having ordinary skill in the art. An example light-extraction feature 1604 is shown in FIG. 16.

The example embodiments having been described in detail in connection through a discussion of exemplary embodiments, it is clear that modifications of the invention will be apparent to one having ordinary skill in the art having had the benefit of the present disclosure. Such modifications and variations are included in the scope of the appended claims.

The invention claimed is:

1. A light source, comprising:
   a first waveguide, which includes a light emitting material having a first index of refraction;
   at least one layer overlying and substantially parallel to the light emitting material, wherein the at least one layer has a second index of refraction that is less than the first index of refraction;
   a second waveguide overlying and substantially parallel to the first waveguide, with the at least one layer disposed between the first waveguide and the second waveguide, wherein the second waveguide is optically coupled to the first waveguide; and
   a light extraction structure overlying and disposed substantially parallel to the first waveguide, wherein the light extraction structure directs light from the light emitting material into free space.

2. A light source as recited in claim 1, wherein the light emitting material is an organic light-emitting material.

3. A light source as recited in claim 1, wherein the light source is a component of a display device.

4. A light source as recited in claim 1, wherein the light sourcing is a component of a lighting structure.

5. A light source as recited in claim 1, wherein the light emitting material is an inorganic light emitting material.

6. A light source as recited in claim 3, wherein a mode having a coupling length is coupled between the first and second waveguides, and the coupling length is less than a width of a pixel of the display device.

7. A light source as recited in claim 1, wherein the light extraction structure comprises a plurality of microlenses.

8. A light source as recited in claim 1, wherein the light extraction structure is a light scattering structure.

9. A light source as recited in claim 8, wherein the light scattering structure includes a plurality of light scattering sites.

10. A light source as recited in claim 1, further comprising a substrate and an air gap between the substrate and the second waveguide.

11. A light source as recited in claim 1, wherein the light source is a bottom-emitting light source.

12. An organic light emitting device (OLED), comprising:
a first waveguide, which includes an organic light emitting material having a first index of refraction, and a cathode and an anode;
at least one layer disposed substantially parallel to the material, wherein the at least one layer has a second index of refraction that is less than the first index of refraction;
a second waveguide disposed substantially parallel to the first waveguide, with the at least one layer disposed between the first waveguide and the second waveguide, wherein the second waveguide is optically coupled to the first waveguide; and
a light extraction structure disposed substantially parallel to the first waveguide.

13. An OLED as recited in claim 12, wherein the OLED is a component of a display device.

14. An OLED as recited in claim 12, wherein the OLED is a component of a lighting structure.

15. An OLED as recited in claim 14, wherein a mode having a coupling length is coupled between the first and second waveguides, and the coupling length is less than a width of a pixel of the OLED.

16. An OLED as recited in claim 12, wherein the light extraction structure comprises a plurality of microlenses.

17. An OLED as recited in claim 12, wherein the light extraction is a light scattering structure.

18. An OLED as recited in claim 17, wherein the light scattering structure includes a plurality of light scattering sites.

19. An OLED as recited in claim 12, further comprising a substrate and an air gap between the substrate and the second waveguide.

20. An OLED as recited in claim 12, wherein the light extraction structure includes an optical grating.

21. An OLED as recited in claim 12, wherein the OLED is a multi-color device comprising pixels.

22. A light source as recited in claim 1, wherein the second waveguide has a third index of refraction that is substantially equal to the first index of refraction.

23. A light source as recited in claim 1, wherein the light extraction structure is located in the second waveguide.

24. A light source as recited in claim 1, wherein the light source is a surface-emitting light source.

25. A light source as recited in claim 12, wherein the second waveguide has a third index of refraction that is substantially equal to the first index of refraction.

* * * * *